United States Patent [19]

Miyayama

[11] Patent Number: 4,587,499
[45] Date of Patent: May 6, 1986

[54] TEMPERATURE COMPENSATING CIRCUIT FOR OSCILLATOR

[75] Inventor: Takashi Miyayama, Samukawa, Japan

[73] Assignee: Toyo Communication Equipment Co., Ltd., Kanagawa, Japan

[21] Appl. No.: 501,126

[22] Filed: Jun. 6, 1983

[30] Foreign Application Priority Data

Jun. 7, 1982 [JP] Japan .................................. 57-97240
May 10, 1983 [JP] Japan .................................. 58-82151

[51] Int. Cl.$^4$ ............................................. H03L 1/02
[52] U.S. Cl. ..................................... 331/176; 331/158
[58] Field of Search ......................... 331/66; 331/176; 331/158

[56] References Cited

U.S. PATENT DOCUMENTS 4,020,426  4/1977  Hellé ............................... 331/176 X
4,072,912  2/1978  Pradal ............................. 331/176 X
4,412,188  10/1983 Helle et al. ......................... 331/176

Primary Examiner—Siegfried H. Grimm
Attorney, Agent, or Firm—Spensley Horn Jubas & Lubitz

[57] ABSTRACT

In a temperature compensating circuit for an oscillator, a reference voltage is applied between a pair of opposing nodes in a basic bridge circuit having a temperature sensitive element inserted in an arbitrary branch of the bridge. An input terminal of the oscillator is connected between the other pair of opposing nodes, from which nodes an output voltage of the bridge is supplied to the oscillator. The temperature compensating circuit is featured in that a voltage from another power source is applied to the other pair of opposing nodes through predetermined resistances, and that the values of the bridge components and the predetermined resistance are selected so that the output voltage supplied to the oscillator is kept constant at a specific reference temperature regardless of variations in the another power source voltage, and so that temperature-voltage characteristic of the bridge output voltage varies in correspondence with the temperature-frequency characteristic of the oscillator without changing oscillation frequency at a specific reference temperature.

12 Claims, 14 Drawing Figures

VARIABLE-CAPACITANCE DIODE

TEMPERATURE COMPENSATING CIRCUIT FOR OSCILLATOR

BACKGROUND OF THE INVENTION

1. Field of the Invention

The present invention relates generally to an improvement in a temperature compensating circuit for all kinds of oscillators, especially crystal oscillator (referred to as TCXO, hereinafter), and more particularly, to a temperature compensating circuit for a oscillator in which circuit's compensation characteristic can be varied easily according to the characteristic of the oscillator and to variations in the characteristic, and in which the compensation characteristic can be expanded to a wide temperature range apart from the reference temperature vicinity.

2. Description of the Prior Art

A temperature compensating circuit for a TCXO is used to keep constant the oscillation frequency of the TCXO independently of temperature. In a prior-art temperature compensating circuit, a D.C. voltage supplied from a constant-voltage supply circuit is divided through a voltage divider of combined resistances including such an element having a temperature-resistance coefficient as a thermistor, and the divided voltage is applied to a variable-capacitance diode connected with a voltage-controlled crystal oscillator (referred to as VCXO, hereinafter), whereby the load capacity of the crystal oscillator is varied according to temperature to thereby compensate for the temperature-frequency characteristic of the oscillator.

However, the temperature-frequency characteristic of the crystal oscillator used in the TCXO is expressed generally by a third-order curve, and the oscillation characteristic is also affected by the respective temperature characteristics of the circuit elements. As a result, many calculating steps are required to determine the constants of the temperature compensating circuit. In addition, to provide proper compensation in response to variations in the characteristic of the oscillator, the calculation of the compensating circuit constants and the measurement for confirmation of the calculation results must be troublesomely repeated.

FIG. 1 shows a basic equivalent circuit of a prior-art TCXO temperature compensating circuit, wherein a basic bridge circuit includes resistors $R_1$ to $R_5$. At least one of the resistor $R_1$ to $R_5$ must include the equivalent resistance component of a temperature sensitive element, but, in principle, some or all of them may be temperature-dependent.

The resistor $R_5$ between nodes 3 and 4 corresponds to a combined resistance of an equivalent resistance component of a variable-capacitance diode and a resistance component in an input terminal circuit of a VCXO for frequency change. In the case where there are resistances between the input terminal circuit and ground, these resistances can be included in the resistors $R_2$ and $R_4$.

In operation, when a reference source voltage $E_1$ is applied to a node 1, a potential difference appears between the nodes 3 and 4. The differential voltage is supplied to the VCXO to compensate for the temperature-frequency characteristic of the crystal oscillator and to keep the oscillation frequency constant independently of temperature.

A typical TCXO temperature compensating circuit generally has such a configuration as shown in FIG. 2, in which we can consider that a temperature compensating circuit 2 for a VCXO 1 shown in FIG. 2 is a special case of the counterpart shown in FIG. 1, that is, corresponds to a case where the node 3 is grounded. In this case, it will be readily appreciated that a combined resistance of a resistance component $R_T$ of a thermistor and resistors $R_6$ and $R_7$ corresponds to the resistor $R_3$ in FIG. 1, and that a high-frequency blocking resistor $R_8$ corresponding to the resistance component of the input terminal of the VCXO and the resistance component of a variable-capacitance diode D are included in the resistor $R_5$ in FIG. 1.

With the prior-art temperature compensating circuit of such an arrangement, as will be obvious from FIG. 2, it is troublesome to determine the respective constants of the circuit by means of calculation and further the circuit adjustment involves a lot of difficulties.

The present invention is directed to the elimination of such defects in the prior-art TCXO temperature compensating circuit.

SUMMARY OF THE INVENTION

Accordingly, it is an object of the present invention to provide a temperature compensating circuit for a voltage-controlled crystal oscillator (VCXO) wherein circuit's compensation characteristic can be varied highly easily according to the characteristic of the oscillator and to variations in the characteristic, and wherein the compensation characteristic can be expanded to a wide temperature range apart from its reference temperature vicinity, whereby the oscillation frequency of the oscillator can be made constant accurately and stably throughout a wide temperature range.

According to the present invention, in a temperature compensating circuit for a crystal oscillator wherein a reference voltage is applied between a pair of opposing nodes in a basic bridge circuit having such resistances as the equivalent resistance component of a temperature sensitive element inserted in arbitrary branches of the bridge and wherein a resistor including a resistance of an input terminal of the oscillator is inserted in a branch between the other pair of opposing nodes and wherein a potentioal difference as an output voltage of the bridge is supplied to the crystal oscillator; said circuit is featured in that a voltage from another power source is applied to the other pair of opposing nodes through predetermined resistances, and that the output voltage supplied to the oscillator is kept constant at a specific reference temperature regardless of variations in the another power source voltage, whereby the temperature voltage characteristic is varied according to the temperature-frequency characteristic of the oscillator without causing any change in the oscillation frequency at a specific reference temperature.

BRIEF DESCRIPTION OF THE DRAWINGS

The above and other objects and advantages of the present invention will become clear from the following description with reference to the accompanying drawings, in which.

Resistances and voltages in the equivalent circuits shown in FIGS. 6, 10, 13 and 14 are normalized to the respective unit resistance and unit voltage, and the constant B of a temperature sensitive element is expressed in terms of the temperature-resistance coefficient.

DESCRIPTION OF PREFERRED EMBODIMENTS

Figure 1:
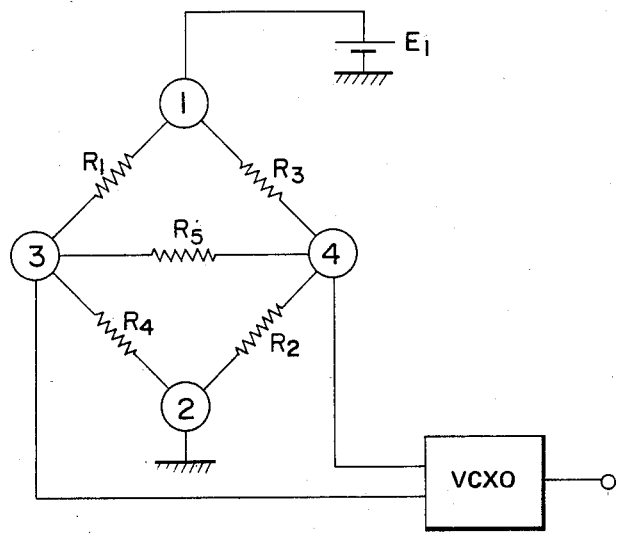
FIG. 1 is an equivalent circuit showing the basic configuration of a prior-art TCXO temperature compensating circuit.
Figure 2:
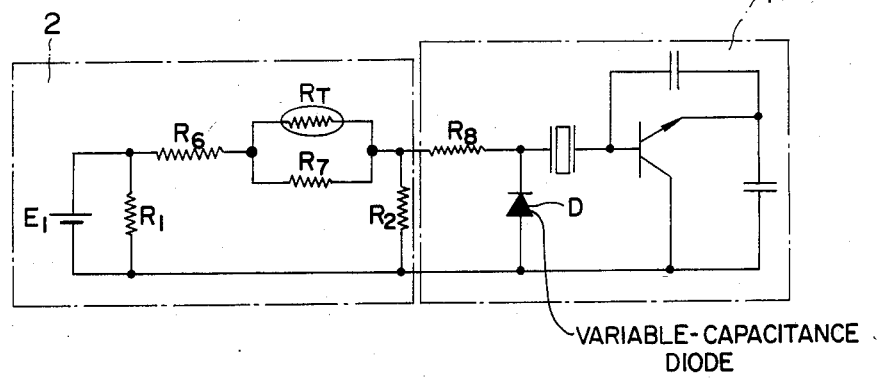
FIG. 2 is a circuit diagram showing an example of the compensating circuit according to the equivalent circuit of FIG. 1.
Figure 3:
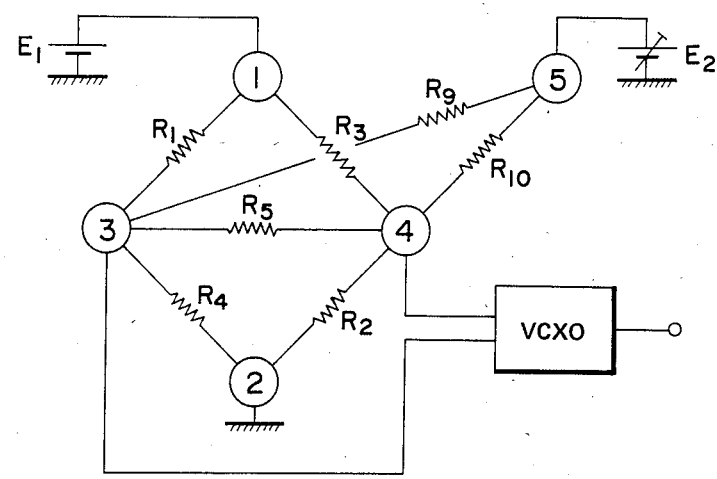
FIG. 3 is an equivalent circuit showing a basic configuration of a temperature compensating circuit in accordance with the present invention.

Referring to FIG. 3 which shows an equivalent circuit of a basic arrangement of a temperature compensating circuit according to the present invention, in which the nodes 3 and 4 in the prior art circuit of FIG. 1 are connected through respective resistors $R_9$ and $R_{10}$ to a common node 5 which in turn leads to a second power source $E_2$. An output voltage from the second power source $E_2$ is applied between the nodes 3 and 4 so that a potential difference between the nodes 3 and 4 is supplied to a VCXO as its input voltage.

With the temperature compensating circuit of such an arrangement as mentioned above, in order to control the oscillation frequency at an arbitrary temperature equal to that at a reference temperature without any need for calculating the circuit constants, it is necessary that the oscillation frequency at the reference temperature will not be varied even if a voltage supplied to the VCXO is adjusted. In other words, the circuit constants must be selected so that the potential difference between the nodes 3 and 4 is independent of the second source voltage $E_2$.

Figure 4:
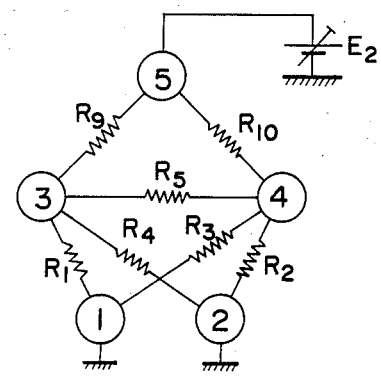
FIGS. 4 and 5 are equivalent circuits to which the equivalent circuit of FIG. 3 is converted according to Principle of Superposition and the net-star conversion.

In order to find the above requirement, the circuit of FIG. 3 is converted to an equivalent circuit as shown in FIG. 4 in accordance with Principle of Superposition of linear network and condition in which the potential difference between the nodes 3 and 4 is zero is to be found.

Figure 5:
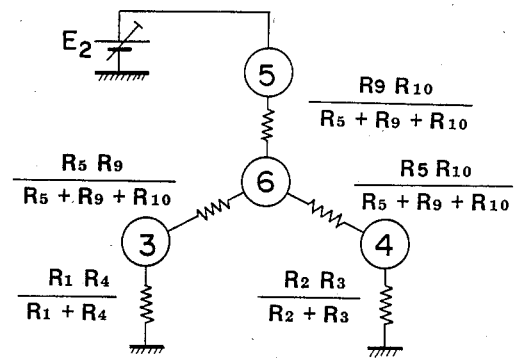

The circuit of FIG. 4 is further converted to another equivalent circuit as shown in FIG. 5 through net-star conversion. Therefore, the condition that the potential difference between the nodes 3 and 4 becomes zero is replaced by the condition that a potential of the node 3 with respect to ground is equal to a potential of the node 4 with respect to ground. That is, the following equation must be satisfied.

$$R_1R_4/R_9(R_1+R_4) = R_2R_3/R_{10}(R_2+R_3) \qquad (1)$$

Note that the equation (1) does not contain the resistor $R_5$ including the resistance component of the input terminal of the VCXO and thus is not affected by the resistor $R_5$. This means that any type of the equivalent resistor $R_5$, for example, such a type of temperature sensitive element as its resistance value is varied in response to temperature can be used, which is highly desirable for the circuit design.

As a result, the basic equivalent circuit of the present invention shown in FIG. 3 can be modified as follows.
(I) The resistor $R_5$ is open-circuited.
(II) Either or both of the equivalent resistances inserted in the opposing branches of the bridge circuit of FIG. 3 are selected to be infinite.

The conditions that the potential difference between the nodes 3 and 4 in the bridge circuit is independent of the second source voltage $E_2$, are tabulated below in the cases (I) and (II).

| Modified Example | | Conditions | Equation No. |
|---|---|---|---|
| (I) | Open-circuit of $R_5$ | $R_1R_4/R_9(R_1+R_4) = R_2R_3/R_{10}(R_2+R_3)$ | (1) |
| | $R_3 \to \infty$ | $R_1R_4/R_9(R_1+R_4) = R_2/R_{10}$ | (2) |
| | $R_4 \to \infty$ | $R_1/R_9 = R_2R_3/R_{10}(R_2+R_3)$ | (3) |
| | $R_3 \to \infty$ $R_4 \to \infty$ | $R_1/R_9 = R_2/R_{10}$ | (4) |
| (II) | $R_1 \to \infty$ | $R_4/R_9 = R_2R_3/R_{10}(R_2+R_3)$ | (5) |
| | $R_2 \to \infty$ | $R_1R_4/R_9(R_1+R_4) = R_3/R_{10}$ | (6) |
| | $R_1 \to \infty$ $R_2 \to \infty$ | $R_4/R_9 = R_3/R_{10}$ | (7) |

The conditions (I) and/or (II) can be combined.

Figure 6:
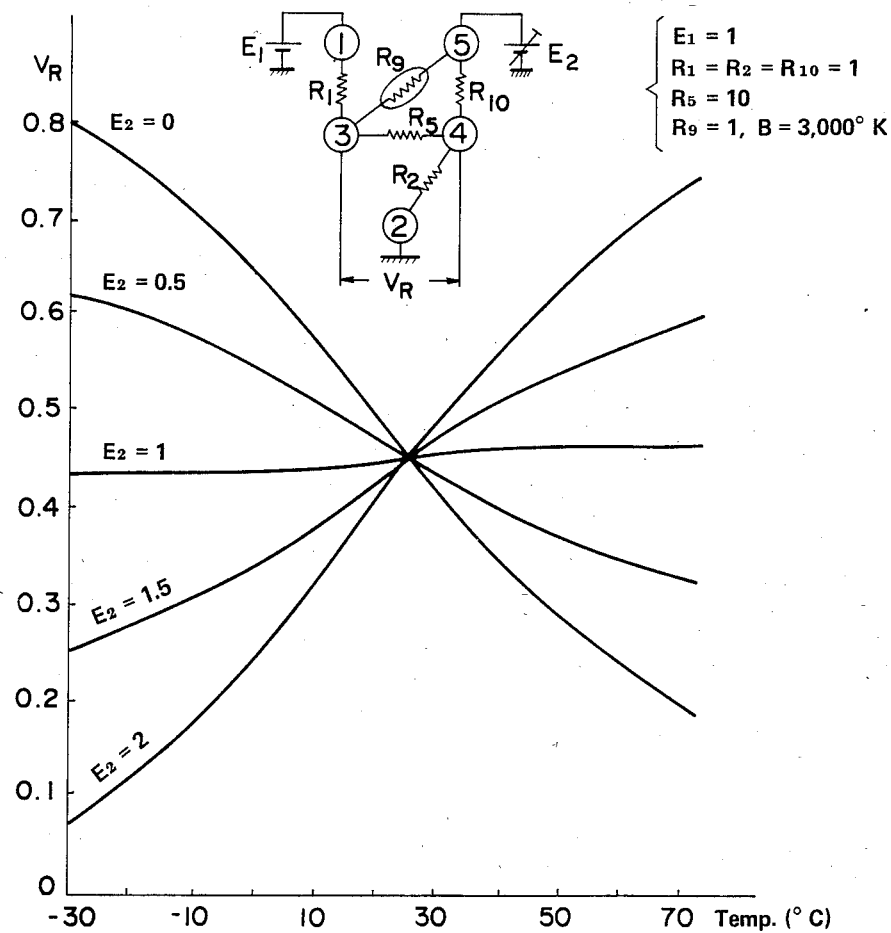
FIG. 6 is a simulation result showing the relation between the temperature and the voltage supplied to a VCXO in an embodiment of the compensating circuit of the present invention.

Referring to FIG. 6, there is shown an example graphically representing variations in the potential difference generated between the nodes 3 and 4, i.e., in the voltage to be supplied to the VCXO in response to temperature change, when $R_3$ and $R_4$ are selected both to be infinite, i.e., when the circuit constants are selected to satisfy the equation (4) (in the case of the modified example in Table).

As will be clear from FIG. 6, the voltage applied to the VCXO at the reference temperature of 25° C. is fixed and in the temperature zone other than the reference temperature, a compensation curve with a proper gradient is given to provide a proper compensation. That is, the curve can be made to conform to the temperature-frequency characteristic curve of the VCXO by adjusting properly the second source voltage $E_2$.

A voltage from a third power source may be applied between the nodes 3 and 4 via respective suitable resistances. In this case, for example, the second source voltage can be coarsely adjusted and then the third source voltage can be finely adjusted.

If necessary, some stages of similar circuits may be added.

Figure 7:
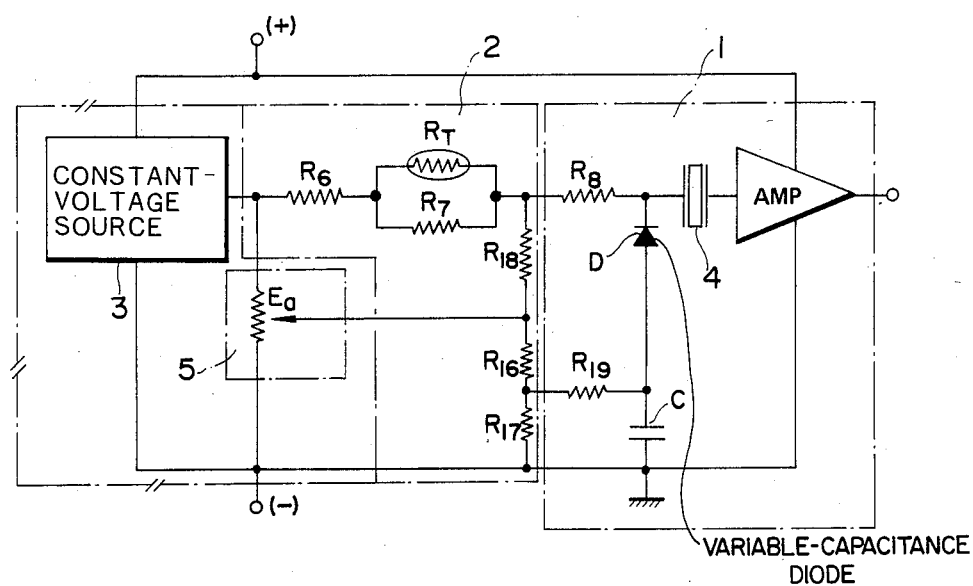
FIG. 7 is a circuit diagram showing another embodiment of the TCXO compensating circuit of the present invention.

FIG. 7 shows a practical circuit including a temperature compensating circuit as one of the modified examples. In FIG. 7, a constant D.C. voltage stabilized by a constant-voltage source 3 is supplied to the temperature compensating circuit 2. The circuit 2 includes resistors $R_6$ and $R_7$, a thermistor $R_T$, a voltage dividing resistor $R_{18}$, a variable voltage source 5 connected in series with the voltage dividing resistor $R_{18}$, and a pair of resistors $R_{16}$ and $R_{17}$ for dividing a variable voltage from the source 5. The variable voltage $E_2$ in turn is obtained from the regulated source 3 through a potentiometer. A divided voltage of the variable voltage $E_2$ divided by the pair of the resistors $R_{16}$ and $R_{17}$ is supplied from a connection between the resistors $R_{16}$ and $R_{17}$ through a high-frequency blocking resistor $R_{19}$ to the anode of a variable-capacitance diode D which forms a part of the VCXO circuit 1.

In FIG. 7, the combined resistor of $R_6$, $R_7$ and $R_T$ corresponds to $R_3$ in FIG. 3, and $R_{18}$, $R_{16}$ and $R_{17}$ correspond to $R_{10}$, $R_9$ and $R_4$ in FIG. 3, respectively. Further, values of $R_1$ and $R_2$ in FIG. 3 are made infinite in FIG. 7.

A high frequency blocking resistor $R_8$ is placed between the output terminal of the temperature compensating circuit 2 and the cathode of the diode D, and a high-frequency bypassing capacitor C is inserted between the anode of the diode D and the ground.

Figure 8:
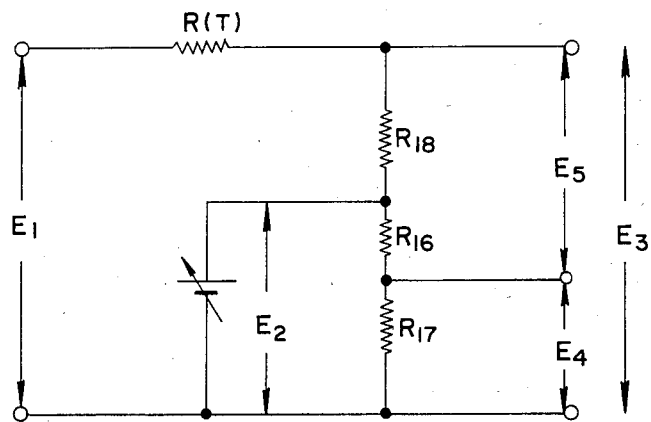
FIG. 8 is a circuit diagram for generating voltages to be applied to various points in the circuit of FIG. 7.

With the temperature compensating circuit arranged in the above manner, such a voltage as shown in FIG. 8 is applied to the diode D. That is, a voltage $E_5$ expressed by ($E_3-E_4$) is applied to the variable-capacitance diode D, where $E_3$ is the output voltage of the temperature compensating circuit 2 and $E_4$ is a voltage divided by the resistors $R_{16}$ and $R_{17}$. In FIG. 8, $E_1$ denotes the output of the constant-voltage source 3, and $E_2$ denotes the output of the variable voltage source 5.

It is assumed that R(T) is a combined resistor of the resistance elements other than the dividing resistor $R_{18}$ in the temperature compensating circuit 2. If the resistors R(T), $R_{16}$, $R_{18}$ and $R_{17}$ are not selected to have proper values respectively, then the voltage to be supplied to the diode D at the reference temperature will be unfavorably changed.

Therefore, let us examine the condition when the voltage $E_5$ supplied to the diode D at the reference temperature becomes constant or independent of the level of the variable voltage $E_2$.

If the resistor R(T) in FIG. 8 has a value of $R(T_o)$ at the reference temperature $T_o$, then the following equation is satisfied.

$$E_3 - E_2 = \frac{R_{18}}{R(T_0) + R_{18}} \cdot (E_1 - E_2) \quad (8)$$

$$E_3 = \frac{R_{18}}{R(T_0) + R_{18}} \cdot (E_1 - E_2) + E_2$$

$$= \frac{E_1 - E_2}{R(T_0)/R_{18} + 1} + E_2$$

When $\alpha$ is substituted for $R(T_o)/R_{18}$, the equation (8) is rewritten as follows.

$$E_3 = \frac{E_1 - E_2}{\alpha + 1} + E_2 = \frac{\alpha E_2 + E_1}{\alpha + 1} \quad (9)$$

In the meanwhile, the divided voltage $E_4$ and the voltage $E_5$ supplied to the diode D are expressed by the following equations (10) and (11).

$$E_4 = \frac{R_{17}}{R_{16} + R_{17}} \cdot E_2 = \frac{R_{17}/R_{16}}{1 + R_{17}/R_{16}} \cdot E_2 \quad (10)$$

$$E_5 = E_3 - E_4 = \frac{\alpha E_2 + E_1}{\alpha + 1} - \frac{R_{17}/R_{16}}{R_{17}/R_{16} + 1} \cdot E_2 \quad (11)$$

$$= \left[ \frac{\alpha}{\alpha + 1} - \frac{R_{17}/R_{16}}{R_{17}/R_{16} + 1} \right] \cdot E_2 + \frac{E_1}{\alpha + 1}$$

If the following relation is satisfied, then the equation (11) becomes independent of $E_2$.

$$\frac{\alpha}{\alpha + 1} = \frac{R_{17}/R_{16}}{R_{17}/R_{16} + 1} \quad (12)$$

$$\frac{R_{17}}{R_{16}} = \alpha = \frac{R(T_0)}{R_{18}}$$

From the equation (12), it will be appreciated that, if $R(T_o)/R_{18}$ is selected to be equal to $R_{17}/R_{16}$, the voltage $E_5$ supplied to the diode D is kept constant, even though the voltage $E_2$ of the variable voltage source 5 is adjusted.

Figure 9:
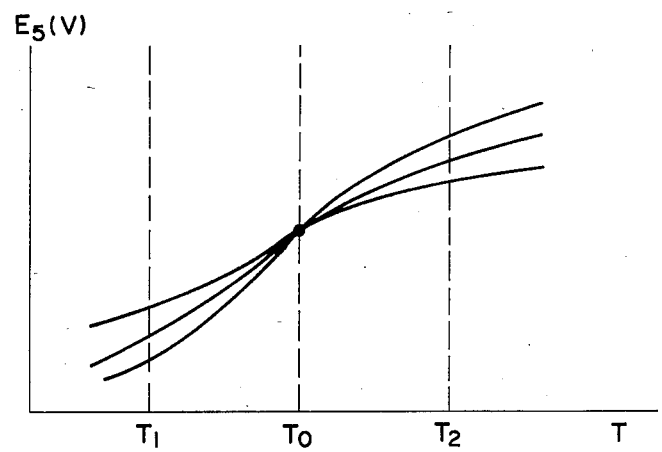
FIG. 9 shows graphs showing the relation between the temperature and the voltage applied to a variable-capacitance diode in the temperature compensating circuit of the embodiment of FIG. 7.
Figure 10:
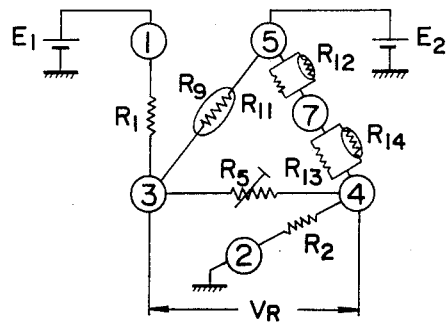
FIG. 10 is a simulation result indicating that, in the embodiment of the temperature compensating circuit of the present invention, the compensation characteristic of the circuit does not vary throughout the entire temperature range even when a voltage to be supplied to the VCXO at a reference temperature is changed to modify the oscillation frequency of the VCXO.
Figure 10:
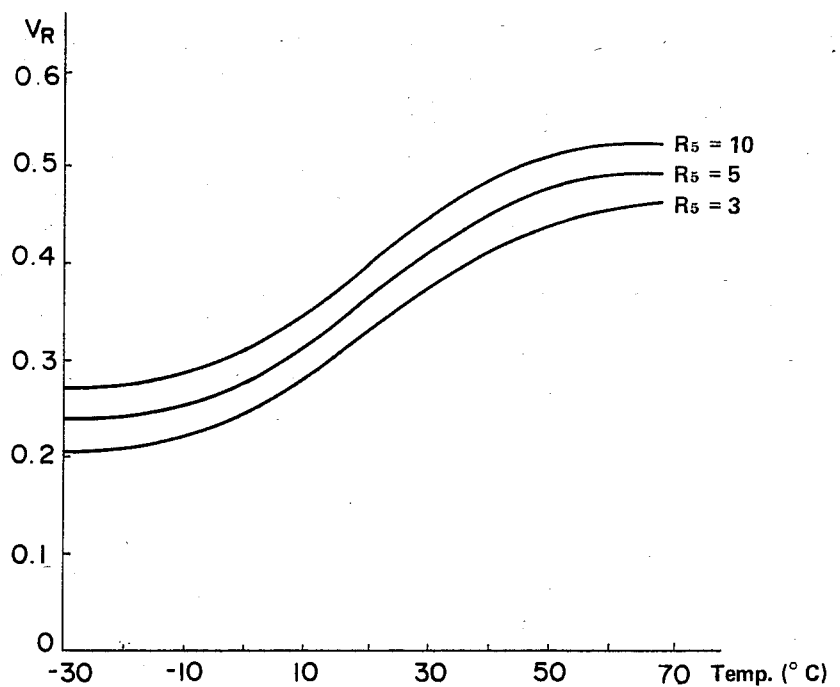

That is, the voltage applied to the diode D at the reference temperature $T_0$ can be kept constant as shown in FIG. 9 and at the same time, a temperature-applied voltage characteristic curve can be made to conform to the frequency-temperature characteristic curve of the VCXO 1. This embodiment of the temperature compensating circuit of FIG. 7 corresponds to a modified example (in Table given earlier) where the resistor $R_5$ is open-circuited and the resistors $R_1$ and $R_2$ are selected to be infinite, respectively.

The potential difference between the nodes 3 and 4 is constant regardless of the value of the resistor $R_5$. This means that the resistor $R_5$ can be used as a frequency changing element. For example, if a variable resistor can be inserted in parallel with the variable-capacitance diode D to apply a varied voltage between the nodes 3 and 4, then the crystal oscillator can be made variable in load capacity, that is, the oscillation frequency of the oscillator can be made variable. As a result, it becomes highly easy to adjust the oscillation frequency at the reference temperature to be a desired value by controlling the resistor $R_5$. Such adjustment will not cause a substantial variation of the temperature-applied voltage characteristic of the temperature compensating circuit.

In order to prove the above, simulation has been conducted. The simulation results are given in FIG. 10. It will be seen from FIG. 10 that the temperature applied voltage characteristic curve is monotonicly shifted in response to changes in the value of the resistor $R_5$, without any practical change in the curve.

With such a circuit configuration, the oscillation-frequency adjusting function can be separated from the temperature compensating function, whereby the circuit can be designed with ease and in actual applications, frequencies can be separately fine-adjusted highly easily without causing any change in the temperature compensating characteristic.

In general, the second source voltage $E_2$ is obtained, by dividing a proper voltage through a potentiometer whose component resistances are much lower than the branch resistances to apply it to the node 5, as in the aforementioned embodiment.

However, such an arrangement requires a large power consumption, and this is disadvantageous when the present invention is applied to modern electronic equipment because the equipment requires energy saving.

Figure 11:
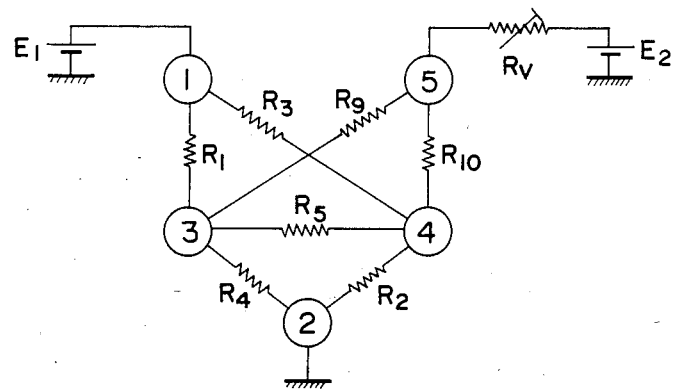
FIG. 11 is an equivalent circuit of a means for changing output voltage of a second power source according to the present invention.

This problem can be resolved, as shown in FIG. 11, by inserting a variable resistor $R_V$ between the node 5 and the second source $E_2$, so that the voltage to be applied between the nodes 3 and 4 can be made variable by adjusting the resistor $R_V$. The insertion of the resistor $R_V$ will not have any effect on the oscillation frequency at the reference temperature, as is clear from the above explanation. This means that, in order to obtain the second source voltage $E_2$, it is not necessary to always use the lower-resistance potentiometer or other active elements for impedance step-down, which is highly advantageous in designing the circuit.

Finally, description will be directed to still another embodiment of the temperature compensating circuit according to the present invention, wherein local compensation is conducted for temperature range apart from the vicinity of the VCXO reference temperature.

The temperature-frequency characteristic of the crystal oscillator is expressed by the third-order curve and further has variations, as mentioned earlier. Therefore, it is practically impossible to provide a complete compensation for the wide entire temperature range with the use of the above relatively simple compensating circuit.

This problem can be resolved basically by making variable, for example, the voltage $E_2$ at a temperature other than the reference temperature to cancel the first-order term in the frequency-temperature characteristic equation of the crystal oscillator, and further by making variable one or more of the branch resistances in FIG. 3 to locally compensate for frequency deviation in high and/or lower temperature zone(s), whereby the condition shown by the equation (1) at a temperature close to the reference level is not unsatisfied to a large extent. For this purpose, the resistor(s) inserted in at least any one of the branches in FIG. 3 is replaced by a temperature sensitive element and a variable resistor connected in parallel or series therewith.

Figure 12:
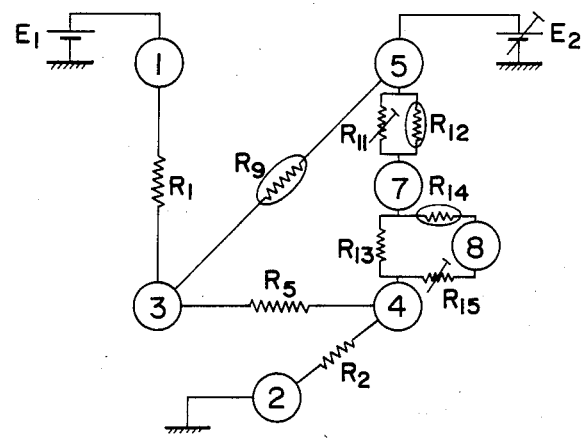
FIG. 12 is an equivalent circuit showing an embodiment of the circuit for locally compensating for a temperatures zone shifted from the reference temperature in accordance with the present invention.
Figure 13:
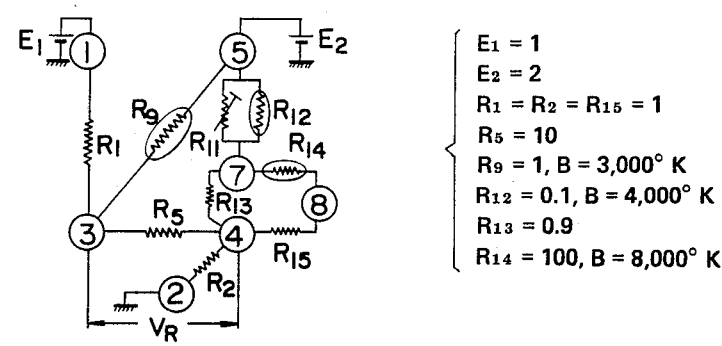
FIGS. 13 and 14 are simulation diagrams showing how temperature is compensated for by the circuit of FIG. 12, for different circuit element values.
Figure 13:
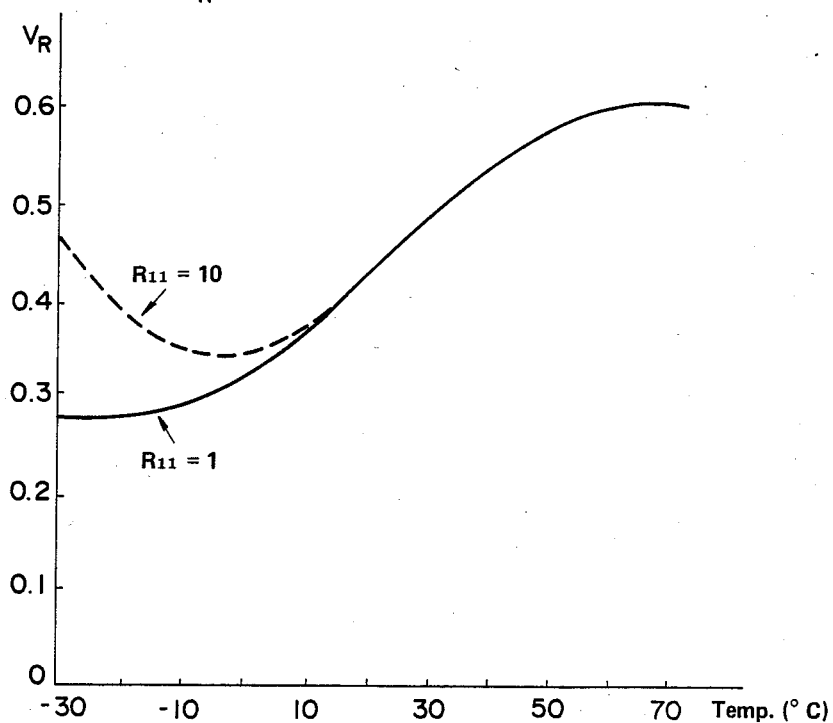
Figure 14:
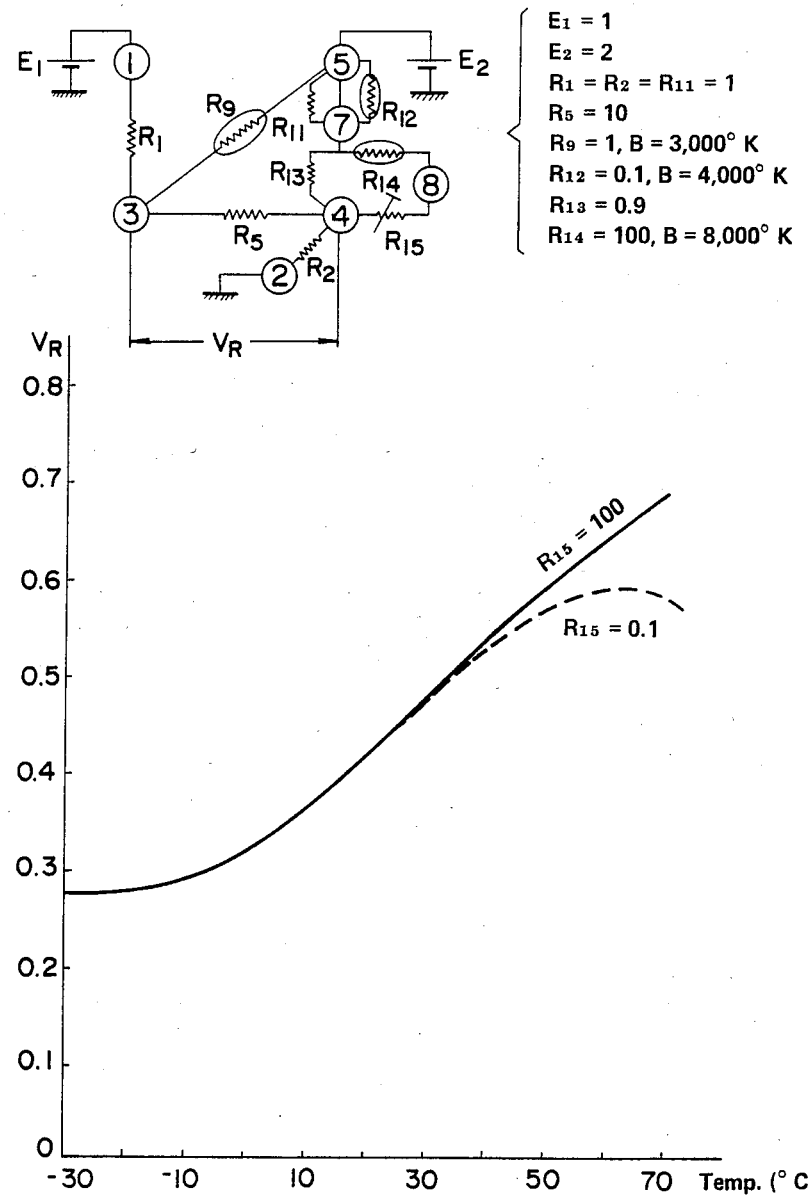

An embodiment of the locally compensating circuit according to the above idea is shown in the form of an equivalent circuit of FIG. 12 wherein the resistors $R_3$ and $R_4$ in FIG. 3 are both selected to be infinite, the resistance $R_9$ between the nodes 3 and 5 in FIG. 3 is in the form of a thermistor, and the resistor $R_{10}$ between the nodes 4 and 5 in FIG. 3 comprises a first parallel-connected circuit of a variable resistor $R_{11}$ and a thermistor equivalent resistor $R_{12}$ as well as a second parallel-connected circuit of a resistor $R_{13}$ and a thermistor equivalent resistance $R_{14}$, the first parallel-connection being coupled in series with the second one via a node 7, a variable resistor $R_{15}$ being inserted between the thermistor $R_{14}$ and the node 4 via a node 8. The combined resistance of the first and second circuits between the nodes 4 and 5 in FIG. 12 may be selected equal to the resistor $R_{10}$ in FIG. 3.

With the circuit arranged in the above manner, if the resistor $R_{11}$ is changed at a temperature much lower than the reference level, then the potential difference between the nodes 3 and 4 can be varied in a considerable amount at a temperature much lower than the reference level. When the temperature of the circuit with the resistor $R_{11}$ changed as mentioned above is returned back to the reference temperature, the oscillator application voltage at the reference temperature has a slightly different level from the initial one. It has been confirmed, however, that the level difference is very small and practically can be neglected. The simulation result is plotted in FIG. 13.

Similarly, by making the resistor $R_{15}$ variable, the temperature-applied voltage characteristic can be locally compensated for in a temperature zone higher than the reference temperature, as will be readily appreciated from the above description.

Further, it will be easily understood that the temperature-dependent and variable resistor circuit comprised of the temperature sensitive element and variable resistor in parallel or series as mentioned above may be inserted in any of the branches in the basic bridge circuit of FIG. 3, and plural sets of such combination resistance circuits are not necessarily connected in series in the same branch.

In the foregoing description a TCXO has been used as a typical example of the oscillator. However, it is apparent that the temperature compensating circuit of the present invention is not only applicable to a TCXO but may be applied to any type of voltage controlled oscillator circuit whose oscillation frequency is likely to be affected by the surrounding temperature.

What is claimed is:

1. A temperature compensating circuit for a voltage-controlled oscillator wherein a reference voltage from a first voltage source is applied to a first pair of opposing nodes in a basic resistance bridge circuit, said bridge circuit having a resistance component in each branch thereof, a resistance including an input terminal resistance component of said oscillator circuit being connected between a second pair of opposing nodes in said bridge circuit, and a potential difference between said second node pair is supplied as an output voltage to said oscillator;

said compensating circuit being characterized in that a voltage from a second voltage source is applied between said second node pair through respective predetermined resistances, one or more of the resistance components in said branches and said predetermined resistances being a temperature sensitive resistor, and that the circuit components of said bridge and said predetermined resistances have values such that said output voltage to said oscillator at a specific reference temperature remains constant regardless of variations in said voltage from said second voltage source and that the output voltage-temperature characteristic of said supplied output voltage compensates for the temperature-frequency characteristic of said oscillator.

2. A compensating circuit as set forth in claim 1, characterized in that one of said predetermined resistances of said voltage application circuit connected to said second node pair and applied with the voltage from said second source comprises at least one combination circuit of a resistance element and a temperature sensitive element, the total equivalent resistance value of said combination circuit being equal to the value of said predetermined resistance, and the value of said resistance element is made variable, whereby local compensation is provided for at least one temperature zone apart from the vicinity of said reference temperature.

3. A compensating circuit as set forth in claim 1, characterized in that a resistance is connected in series with said second voltage source whose voltage is applied between said second node pair of said basic bridge, said connected resistance being made variable to change the voltage applied between said second node pair.

4. A compensating circuit as set forth in claim 1, characterized in that at least one of the resistances forming said bridge circuit includes the equivalent resistance component of said temperature sensitive resistor.

5. A compensating circuit as set forth in claim 1 wherein said basic bridge circuit is a Wheatstone bridge.

6. A temperature compensating circuit including a temperature sensitive element having a temperature-resistance coefficient and resistances for dividing a D.C. voltage supplied from a constant voltage source, characterized in that a variable voltage source is connected in series with said divider resistances, a pair of resistances are connected in parallel with said variable voltage source to divide the variable voltage, a voltage difference between a voltage divided by said resistance pair and a voltage divided by said D.C. voltage divider resistances is applied to a varactor diode for a voltage-controlled crystal oscillator to be controlled by said temperature compensating circuit, a ratio of the value of said divider resistances of said compensating circuit at a compensation reference temperature is selected to be equal to the ratio between the values of said resistance pair, whereby, even if a D.C. voltage supplied from said variable voltage source is changed, a voltage to be applied to said diode at said reference temperature is always kept constant and at the same time the temperature-applied voltage characteristic of said diode is changed to compensate for the temperature-frequency characteristic of said oscillator.

7. A temperature compensating circuit for a voltage controlled oscillator which has certain characteristics of frequency as a function of temperature and of frequency as a function of applied control voltage, said compensating circuit comprising:
a resistance bridge having first and second pairs of opposing nodes connected by respective first through fourth resistance elements, a reference voltage source being connected across said first pair of said opposing nodes,
the control voltage for said oscillator being obtained across said second pair of opposing nodes,
a fifth resistance element connecting said second pair of opposing nodes,
an adjustable voltage source having one of its terminals connected by respective sixth and seventh resistance elements to said second pair of opposing nodes, the other terminal of said adjustable voltage source being connected to one node of said first pair of opposing nodes,
the values of said first through seventh resistances being selected so that the potential difference across said second pair of opposing nodes at a reference temperature is independent of the voltage selected from said adjustable voltage source,
at least one of said first through seventh resistance elements including a temperature sensitive component selected to provide across said second pair of opposing nodes an output voltage for controlling said oscillator, which output voltage has a voltage-temperature characteristic such that when used to control said oscillator, the resultant oscillator frequency will be substantially constant over a predetermined temperature range.

8. A temperature compensating circuit for a voltage controllable oscillator having a certain frequency-temperature characteristic, said circuit comprising:
first, second, third and fourth resistance elements connected in series, at least one of said resistance elements including a temperature sensitive component,
a first reference voltage source connected across said four resistance elements,
a second variable voltage source connected across said third and fourth resistance elements,
the control voltage for controlling said oscillator being obtained across said second and third resistance elements, the ratio of the resistance values of said first and second resistance elements being equal to the ratio of the resistance values of said third and fourth resistance elements, whereby said control voltage for said oscillator will remain constant at a reference temperature even though the voltage from said second voltage source is varied, said temperature sensitive component and the voltage from said second variable voltage source being selected so that the variation with temperature of said voltage from said circuit will compensate for the frequency-temperature characteristic of said oscillator.

9. A temperature compensating circuit for a voltage-controlled oscillator wherein a reference voltage from a first voltage source is applied to a first pair of opposing nodes in a four arm resistance bridge circuit which is modified in that one or two of the arms of said bridge circuit are selected to have an infinite resistance, the control voltage input terminals of said oscillator circuit being connected between a second pair of opposing nodes in said bridge circuit, and a potential difference between said second node pair is supplied as an output voltage to said oscillator; said compensating circuit being characterized in that a voltage from a second voltage source is applied between said second node pair through respective predetermined resistances, one or more of the resistances in said branches and said predetermined resistances being a temperature sensitive element, and that the circuit components of said bridge and said predetermined resistances have values such that said output voltage to said oscillator at a specific reference temperature remains constant regardless of variations in said voltage from said second voltage source and that the output voltage-temperature characteristic of said supplied output voltage compensates for the temperature-frequency characteristic of said oscillator.

10. A temperature compensating circuit for a voltage-controlled oscillator wherein a reference voltage from a first voltage source is applied to a first pair of opposing nodes in a bridge circuit of Wheatstone configuration which is modified in that one of the resistances in one of the two pairs of opposing branches of said bridge circuit is substantially infinite, a resistance including an input terminal resistance component of said oscillator circuit being connected between a second pair of opposing nodes in said bridge circuit, and a potential difference between said second node pair is supplied as an output voltage to said oscillator; said compensating circuit being characterized in that a voltage from a second voltage source is applied between said second node pair through respective predetermined resistances, one or more of the resistances in said branches and said predetermined resistances being a temperature sensitive element, and that the circuit components of said bridge and said predetermined resistances have values such that said output voltage to said oscillator at a specific reference temperature remains constant regardless of variations in said voltage from said second voltage source and that the output voltage-temperature characteristic of said supplied output voltage compensates for the temperature-frequency characteristic of said oscillator.

11. A temperature compensating circuit for a voltage-controlled oscillator wherein a reference voltage from a first voltage source is applied to a first pair of opposing nodes in a bridge circuit of Wheatstone configuration which is modified in that both of the resistances in one of the two pairs of opposing branches of said Wheatstone bridge circuit are substantially infinite, a resistance including an input terminal resistance component of said oscillator circuit being connected between a second pair of opposing nodes in said bridge circuit, and a potential difference between said second node pair is supplied as an output voltage to said oscillator; said compensating circuit being characterized in that a voltage from a second voltage source is applied between said second node pair through respective predetermined resistances, one or more of the resistances in said branches and said predetermined resistances being a temperature sensitive element, and that the circuit components of said bridge and said predetermined resistances have values such that said output voltage to said oscillator at a specific reference temperature remains constant regardless of variations in said voltage from said second voltage source and that the output voltage-temperature characteristic of said supplied output voltage compensates for the temperature-frequency characteristic of said oscillator.

12. A temperature compensating circuit for a voltage-controlled oscillator wherein a reference voltage from a first voltage source is applied to a first pair of opposing nodes in a resistance bridge circuit of generally Wheatstone configuration, a resistance including an input terminal resistance component of said oscillator circuit being connected between a second pair of opposing nodes in said bridge circuit, and a potential difference between said second node pair is supplied as an output voltage to said oscillator; said compensating circuit being characterized in that a voltage from a second voltage source is applied between said second node pair through respective predetermined resistances, and that the circuit components of said bridge and said predetermined resistances have values such that said output voltage to said oscillator at a specific reference temperature remains constant regardless of variations in said voltage from said second voltage source and that the output voltage-temperature characteristic of said supplied output voltage compensates for the temperature-frequency characteristic of said oscillator, and wherein the resistance component of a temperature sensitive element is inserted as a component of one of said predetermined resistances.

* * * * *